US006590940B1

(12) United States Patent
Camp, Jr. et al.

(10) Patent No.: US 6,590,940 B1
(45) Date of Patent: Jul. 8, 2003

(54) POWER MODULATION SYSTEMS AND METHODS THAT SEPARATELY AMPLIFY LOW AND HIGH FREQUENCY PORTIONS OF AN AMPLITUDE WAVEFORM

(75) Inventors: William O. Camp, Jr., Chapel Hill, NC (US); Bengt Lindoff, Lund (SE)

(73) Assignee: Ericsson Inc., Research Triangle Park, NC (US)

( * ) Notice: Subject to any disclaimer, the term of this patent is extended or adjusted under 35 U.S.C. 154(b) by 0 days.

(21) Appl. No.: 09/312,469

(22) Filed: May 17, 1999

(51) Int. Cl.[7] .............................................. H04L 25/49
(52) U.S. Cl. ...................... 375/297; 375/295; 330/149; 332/145
(58) Field of Search .................................. 375/295, 297, 375/300; 330/149, 129, 137, 10; 455/102, 126; 332/103, 145

(56) References Cited

U.S. PATENT DOCUMENTS

| 3,900,823 A | * | 8/1975 | Sokal et al. ................. 332/145 |
| 4,972,440 A |   | 11/1990 | Ernst et al. .................. 375/296 |
| 5,430,416 A | * | 7/1995 | Black et al. ................. 330/149 |
| 5,705,959 A |   | 1/1998 | O'Loughlin .................. 332/151 |
| 6,175,273 B1 | * | 1/2001 | Sigmon et al. ............... 330/10 |
| 6,181,199 B1 |   | 1/2001 | Camp, Jr. et al. |
| 6,191,653 B1 | * | 2/2001 | Camp, Jr. et al. ........... 330/129 |
| 6,295,442 B1 |   | 9/2001 | Camp, Jr. et al. |
| 6,449,465 B1 | * | 9/2002 | Gailus et al. ............... 455/126 |

FOREIGN PATENT DOCUMENTS

| EP | 0 360 178 A2 | 3/1990 |
| EP | 0 382 695 A2 | 8/1990 |
| EP | 0 863 607 A1 | 9/1998 |

OTHER PUBLICATIONS

International Search Report, PCT/US00/09662, Oct. 5, 2000.

* cited by examiner

Primary Examiner—Shuwang Liu
(74) Attorney, Agent, or Firm—Myers Bigel Sibley & Sajovec

(57) ABSTRACT

Power modulation systems and methods generate an amplitude waveform and phase waveform from data symbols. The amplitude waveform includes a low frequency portion and a high frequency portion. The phase waveform is phase modulated to produce a phase modulated waveform. A power amplifier, preferably a Class C power amplifier, includes a power supply input, a signal input and a power output. The phase modulated waveform is applied to the signal input. The low frequency portion of the amplitude waveform is amplified at high efficiency to produce an amplified low frequency portion. The high frequency portion is amplified at lower efficiency to produce an amplified high frequency portion. The amplified low frequency portion and the amplified high frequency portion are combined to produce a combined amplified amplitude waveform. The combined amplified amplitude waveform is applied to the power supply input of the power amplifier to produce a power modulated waveform of the data symbols at the power output of the power amplifier.

28 Claims, 12 Drawing Sheets

Lowpass Filter fc 226

+

Digital Prefilter 410

=

Filter fc + Prefilter 242

Digitalpass Highpass Filter 254

Lowpass Filter fh 258

Combined Response 272

Lowpass Filter fc 226

Digital Prefilter 410

Digitalpass Highpass Filter 254

Filter fc + Prefilter 242

Lowpass Filter fh 258

Combined Response 272

POWER MODULATION SYSTEMS AND METHODS THAT SEPARATELY AMPLIFY LOW AND HIGH FREQUENCY PORTIONS OF AN AMPLITUDE WAVEFORM

FILED OF THE INVENTION

This invention relates to modulation systems and methods and more particularly to systems and methods that can efficiently modulate a signal onto a carrier.

BACKGROUND OF THE INVENTION

Modulation systems and methods are widely used in transmitters to modulate information including voice and/or data onto a carrier. The carrier may be a final carrier or an intermediate carrier. The carrier frequency can be in UHF, VHF, RF, microwave or any other frequency band. Modulators are also referred to as "mixers" or "multipliers". For example, in a mobile radiotelephone, a modulator is used in the radiotelephone transmitter.

In modern radiotelephone communications, mobile radiotelephones continue to decrease in size, cost and power consumption. In order to satisfy these objectives, it is generally desirable to provide modulation systems and methods that can provide high power modulation while reducing the amount of battery power that is consumed. Unfortunately, the power amplifier of a modulator may consume excessive power due to efficiency limitations therein. More specifically, it is known to provide linear Class-A or Class-AB power amplifiers that may have efficiencies as low as 30 percent or less. Thus, large amounts of battery power may be wasted as heat.

A major breakthrough in high efficiency modulation systems and methods is described in application Ser. No. 09/195,384 to the present co-inventor Camp, Jr., et al., entitled Circuit and Method for Linearizing Amplitude Modulation in a Power Amplifier (now U.S. Pat. No. 6,191,653); application Ser. No. 09/195,129 to the present co-inventor Camp, Jr., et al., entitled Circuit and Method for I/Q Modulation with Independent, High Efficiency Amplitude Modulation; application Ser. No. 09/207,167 to the present co-inventor Camp., Jr., entitled Amplitude Modulation to Phase Modulation Cancellation Method in an RF Amplifier (now U.S. Pat. No. 6,295,442) and application Ser. No. 09/226,478 to the present co-inventor Camp, Jr., et al., entitled Power I/Q Modulation Systems and Methods (now U.S. Pat. No. 6,181,199). Each of these copending applications is assigned to the assignee of the present application and the disclosures of all these applications are hereby incorporated herein by reference. These applications describe systems and methods for modulating phase and amplitude separately using high efficiency amplifiers.

FIG. 1 is a block diagram of power modulation systems and methods that separately amplify amplitude and phase according to the above-cited copending applications. As shown in FIG. 1, these power modulation systems and methods 100 include a waveform generator 102 that generates an amplitude waveform G(A(t)) 104 and a phase waveform F(φ(t)) 106 from a plurality of data symbols 108. A phase modulator 110, such as a voltage controlled oscillator (VCO) and/or a phase locked loop (PLL), phase modulates the phase waveform 106 to produce a phase modulated waveform 112. An RF driver amplifier 114 may be included in order to overdrive a power amplifier 116. The power amplifier 116 is preferably a Class-C power amplifier that includes a power supply input 116a, a signal input 116b, and a power output 116c. The phase modulated waveform 112 is applied to the signal input 116b of the Class-C power amplifier 116, either directly from the phase modulator 110 or via the RF driver amplifier 114.

Continuing with the description of FIG. 1, a Class-D amplifier 120 is responsive to the amplitude waveform 104 to supply a variable supply voltage to the power supply input 116a of the power amplifier 116. An analog-to-digital converter, for example a delta sigma modulator 124 that operates from a clock frequency $f_{cl}$, converts the amplitude waveform 104 to a digital signal that is applied to the Class-D amplifier 120. The output of the Class-D amplifier 120 is then lowpass filtered, for example at a frequency $f_c$, by a lowpass filter 126. The amplified amplitude waveform 122 is applied to the power supply input 116a of the power amplifier 116, and the phase modulated waveform 112 is applied to the signal input 116b of the power amplifier 116, to produce a power modulated waveform 130 of the data symbols 108 at the power output 116c. Thus, power modulation systems and methods of FIG. 1 control the supply voltage to the Class-C power amplifier 116 using the Class-D power amplifier 120 in order to maintain a high overall efficiency.

As power modulators are used with increasingly higher frequencies, it may be desirable to further extend the frequency response thereof. For example, satellite radiotelephone communication systems may operate at relatively high frequencies compared to terrestrial radiotelephone communication systems. Accordingly, it may be desirable to extend the frequency response of power modulation systems and methods that separately modulate phase and amplitude.

The frequency response of the power modulation systems and methods of FIG. 1 may be extended by increasing the cutoff frequency $f_c$ of the lowpass filter 126. Unfortunately, if the cutoff frequency of the lowpass filter is increased, noise from the delta sigma modulator 124 may be imparted on the power modulated waveform. Alternatively, a higher clock frequency $f_{cl}$ may be used for the delta sigma modulator. Unfortunately, this may increase the cost and/or decrease the efficiency of the delta sigma modulator 124 and/or the Class-D amplifier 120. Accordingly, there continues to be a need for power modulation systems and methods that can separately modulate phase and amplitude at high frequencies.

SUMMARY OF THE INVENTION

It is therefore an object of the present invention to provide improved power modulation systems and methods.

It is another object of the invention to provide improved power modulation systems and methods that can separately modulate amplitude and phase.

It is yet another object of the present invention to provide systems and methods that can extend the frequency response of power modulation systems and methods that separately modulate amplitude and phase.

These and other objects are provided, according to the present invention by separately amplifying a low frequency portion of an amplitude waveform and a high frequency portion of the amplitude waveform. The low frequency portion, generally containing most of the modulation energy, is preferably amplified at high efficiency to produce an amplified low frequency portion, while the high frequency portion may be amplified at lower efficiency to produce an amplified high frequency portion. The amplified low frequency portion and the amplified high frequency portion are combined to produce a combined amplified amplitude waveform that is applied to the power supply input of a high efficiency power amplifier.

The invention stems from the realization that the energy versus frequency in a conventional amplitude modulation spectrum generally diminishes rapidly with increasing frequency. Accordingly, efficient modulation is used for the low frequency portion of the amplitude waveform. Amplitude modulation frequency components above that frequency may be supplied using more conventional linear methods of modulation and amplification. Thus, the bulk of the amplitude modulation power may be supplied via efficient amplification, while the remaining frequency components, representing very little power, may be supplied via a less efficient but more convenient conventional linear control circuit. Overall high efficiency therefore may be maintained while allowing an extended bandwidth signal to be modulated.

More specifically, power modulation systems and methods according to the invention generate an amplitude waveform and phase waveform from a plurality of data symbols. The amplitude waveform includes a low frequency portion and a high frequency portion. The phase waveform is phase modulated to produce a phase modulated waveform. A power amplifier, preferably a Class-C power amplifier, includes a power supply input, a signal input and a power output. The phase modulated waveform is applied to the signal input. The low frequency portion of the amplitude waveform is amplified at high efficiency to produce an amplified low frequency portion. The high frequency portion is amplified at lower efficiency to produce an amplified high frequency portion. The amplified low frequency portion and the amplified high frequency portion are combined to produce a combined amplified amplitude waveform. The combined amplified amplitude waveform is applied to the power supply input of the power amplifier to produce a power modulated waveform of the data symbols at the power output of the power amplifier.

In a preferred embodiment of the present invention, highpass filtering of the amplitude waveform is used to generate the high frequency portion. The amplifier for the low frequency portion includes a lowpass filter therein. The lowpass filter and the highpass filter have the same cutoff frequency so that flat frequency response is obtained. In another embodiment, the lowpass filter cutoff frequency may vary due to manufacturing tolerance variations and/or other causes. In order to compensate for the variable lowpass filtering, the highpass filter may have an adjustable highpass cutoff frequency that may be adjusted to be the same as the lowpass cutoff frequency. In one embodiment, the lowpass cutoff frequency may be determined using test tones or other probing techniques. The adjustable highpass cutoff frequency is then adjusted to be the same as the lowpass cutoff frequency that is so determined. In another embodiment, the amplitude waveform may be lowpass filtered at a first lowpass cutoff frequency that is lower than the lowpass cutoff frequency that is included in the amplifier for the low frequency portion. This first lowpass cutoff frequency can be accurately controlled, for example by using a digital lowpass filter, so that the highpass filter also may be accurately matched to the digital lowpass filter.

In other embodiments of the present invention, prefiltering may be used to extend the frequency response of the low frequency amplifier. In particular, the low frequency amplifier includes a lowpass filter therein having a lowpass cutoff frequency. The amplitude of the amplitude waveform is raised above the lowpass cutoff frequency to thereby extend the lowpass cutoff frequency to a second lowpass cutoff frequency that is higher than the lowpass cutoff frequency. The amplitude waveform is highpass filtered at the second lowpass cutoff frequency to thereby generate the high frequency portion. An adjustable highpass filter may be used and adjusted to be the same as the second lowpass cutoff frequency.

In yet another embodiment of the present invention, the amplitude waveform may be prefiltered to raise the amplitude of the amplitude waveform above the lowpass cutoff frequency according to a frequency response that is complimentary to the lowpass filter, to thereby flatten the response of the low frequency amplifier beyond the lowpass cutoff frequency. More specifically, the amplitude waveform is prefiltered to produce a prefiltered amplitude waveform. The prefiltered amplitude waveform is amplified to produce an amplified prefiltered amplitude waveform. The amplifier includes a lowpass filter therein having a first cutoff frequency. The prefiltering raises the amplitude of the amplitude waveform above the first lowpass cutoff frequency to thereby extend the first lowpass cutoff frequency to a second lowpass cutoff frequency that is higher than the first lowpass cutoff frequency. More preferably, the amplitude of the amplitude waveform is raised above the first lowpass cutoff frequency according to a frequency response that is complimentary to the lowpass filter to thereby flatten the response of the low frequency amplifier beyond the first lowpass cutoff frequency. In this case, the portion of the amplitude waveform that is amplified by the high frequency lower efficiency amplifier can be reduced or eliminated.

In all of the above embodiments, the low frequency portion preferably is amplified in a Class-D amplifier, the high frequency portion preferably is amplified in a linear amplifier, and the power amplifier is a Class-C amplifier. A delta sigma modulator may be coupled between the waveform generator and the Class-D amplifier to provide analog-to-digital conversion. According to another aspect, the low frequency amplifier produces nonlinear distortion and the power modulation systems and methods generate a predistorted amplitude waveform from the amplitude waveform so that the distorted amplitude waveform is amplified to thereby compensate for the nonlinear distortion.

Accordingly, the frequency response of high efficiency power modulation systems and methods may be extended by amplifying high frequencies using conventional amplifiers. Since the bulk of the amplitude modulation power is supplied via efficient power amplification, high efficiency still may be obtained. Thus, the frequency response may be extended without the need to provide more costly high frequency delta sigma modulators and/or Class-D amplifiers and without the need to introduce additional noise into the modulated waveform. High performance high efficiency power modulation systems and methods thereby may be provided with extended frequency response.

DETAILED DESCRIPTION OF PREFERRED EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Figure 2:
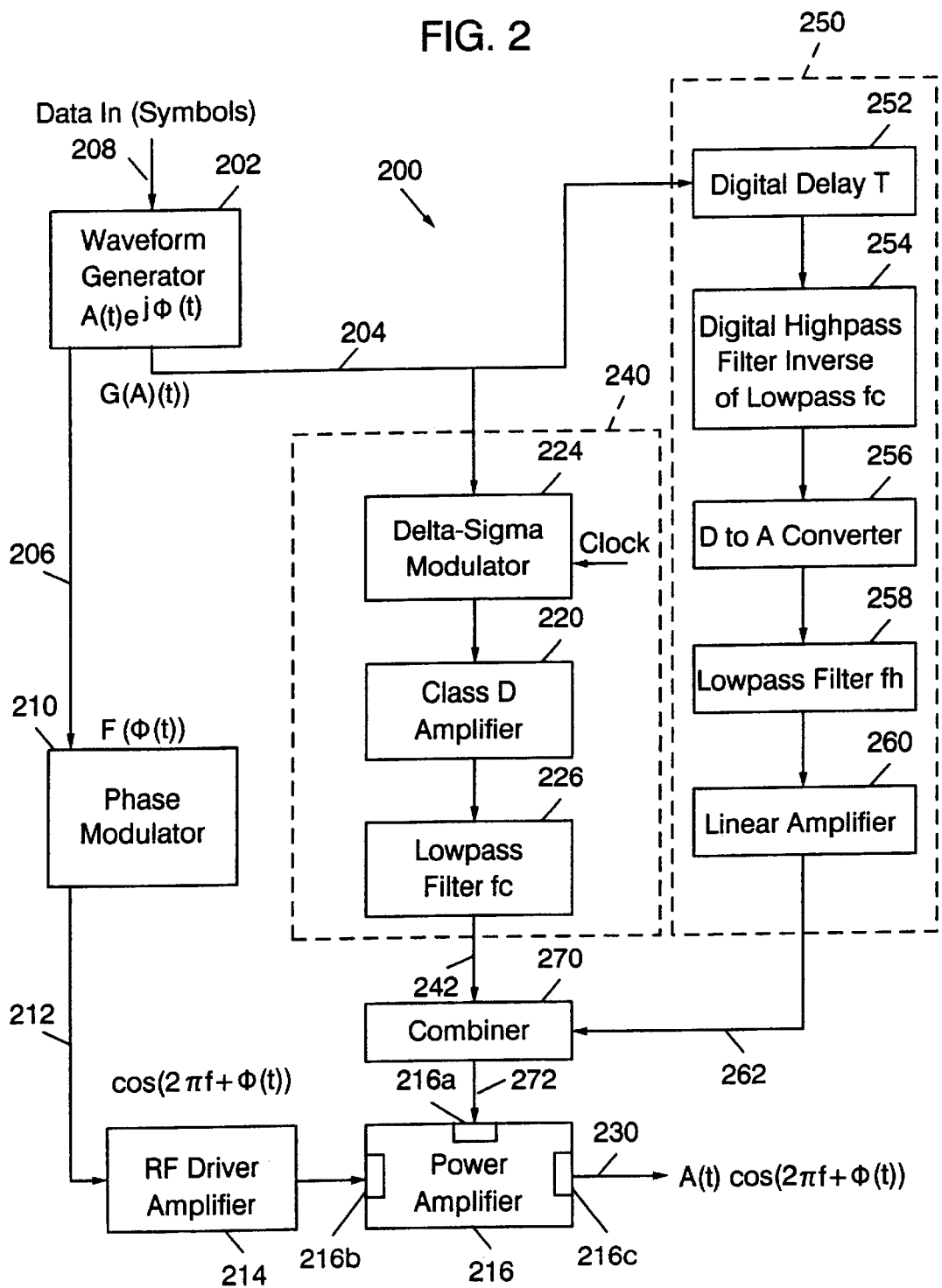
FIGS. 2–4 are block diagrams of embodiments of power modulation systems and methods according to the present invention.

Referring now to FIG. 2, a block diagram of power modulation systems and methods according to the invention will be described. Power modulation systems and methods 200 include a waveform generator 202 that generates an amplitude waveform G(A(t)) 204 and a phase waveform F($\phi$(t)) 206 from a plurality of data symbols 208. The waveform generator 202 creates the baseband modulation signal amplitude and phase waveforms 204 and 206 respectively from the input datastream 208 and the other characteristics of the modulation format, such as the filter shape and symbol rate. The phase waveform 206 preferably is scaled and formatted to yield a desired phase modulated radio frequency signal at a frequency F and is supplied to a phase modulator 210 such as a voltage controlled oscillator (VCO) and/or phase locked loop (PLL) to produce a phase modulated waveform 212.

Still referring to FIG. 2, a power amplifier 216, preferably a high efficiency Class-C power amplifier, includes a power supply input 216a, a signal input 216b and a power output 216c. The phase modulated waveform 212 is applied to the signal input 216b. The phase modulated waveform 212 may be directly applied to the signal input 216b. Alternately, the phase modulated waveform 212 may be applied to an optional RF driver amplifier 214, the output of which is applied to the signal input 216b of the power amplifier 216. The RF driver amplifier 214 may be used to boost the signal level to the point that the signal input level to the power amplifier 216 is sufficient to overdrive the power amplifier 216 into saturation, thus insuring that the power amplifier is operating in Class-C mode and its output responds to the level of the voltage supply to its drain or collector.

Still referring to FIG. 2, the waveform generator 202 also supplies a time synchronized signal, representing the amplitude waveform 204 that is desired. The amplitude waveform 204 includes a low frequency portion and a high frequency portion. A low frequency amplifying system 240 amplifies the low frequency portion at high efficiency to produce an amplified low frequency portion 242. The low frequency amplifying system 240 preferably includes a delta sigma modulator 224 that converts the amplitude waveform into a digital waveform, and a Class-D amplifier 220 that amplifies the digital waveform. Thus, the Class-D amplifier 220 produces a binary waveform whose time average tracks the amplitude modulation waveform. This time average is obtained by filtering the output of the Class-D amplifier using a lowpass filter 226 having a cutoff frequency $f_c$. The lowpass filter 226 also removes noise at the output of the delta sigma modulator 224. Accordingly, the low frequency amplifying system 220 can amplify the bulk of the amplitude modulation power at high efficiency to produce an amplified low frequency portion 242.

Still referring to FIG. 2, a high frequency amplifying system 250 also is provided for amplifying the high frequency portion at lower efficiency to produce an amplified high frequency portion 262. In particular, the high frequency amplifying system 250 may include an optional digital delay unit 252 that can be used to delay the high frequency portion by a time T to thereby synchronize the signals that pass through the low frequency amplifying system 240 and the high frequency amplifying system 250. A highpass filter, preferably a digital highpass filter 254, may be included, that has a highpass filter frequency response that is the inverse of the lowpass filter 226. It will be understood that the highpass filter 254 may be provided as part of the waveform generator 202.

As shown in FIG. 2, the highpass filter 254 and the lowpass filter 226 have the same cutoff frequency $f_c$. Thus, the signals from the low frequency amplifying system 240 and the high frequency amplifying system 250, when added together, will produce a flat frequency response.

The high frequency amplifying system 250 also includes a digital-to-analog (D to A) converter 256 and a second lowpass filter 258 having a cutoff frequency that preferably is set for the highest frequency $f_h$ that is desired for the power modulation. This second lowpass filter 258 can limit the noise that will be imparted on the output signal. The signal from the second lowpass filter 258 is amplified by a conventional linear amplifier 260, for example a Class A or Class AB amplifier having a nominal 40 percent efficiency, to produce the amplified high frequency portion 262.

A combiner 270 combines the amplified low frequency portion 242 and the amplified high frequency portion 262 to produce a combined amplified amplitude waveform 272. The combined amplified amplitude waveform 272 is applied to the power supply input 216a of the power amplifier 216 to produce a power modulated waveform 230 of the data symbols 208 at the power output 216c. The combiner may use capacitive coupling to couple the amplified low frequency portion 242 and the amplified high frequency portion 262 while isolating the low frequency amplifying system 240 and the high frequency amplifying system 250 from one another.

Accordingly, the frequency response of the power modulation systems and methods 200 may be extended beyond the maximum limit that may be imposed by the delta sigma modulator noise. Moreover, this extended frequency response may be obtained with little loss in overall efficiency, because the power supplied by the high frequency amplifying system 250 may be between about one percent and about five percent of the total power that is used to amplitude modulate the power amplifier 216.

Figure 3:
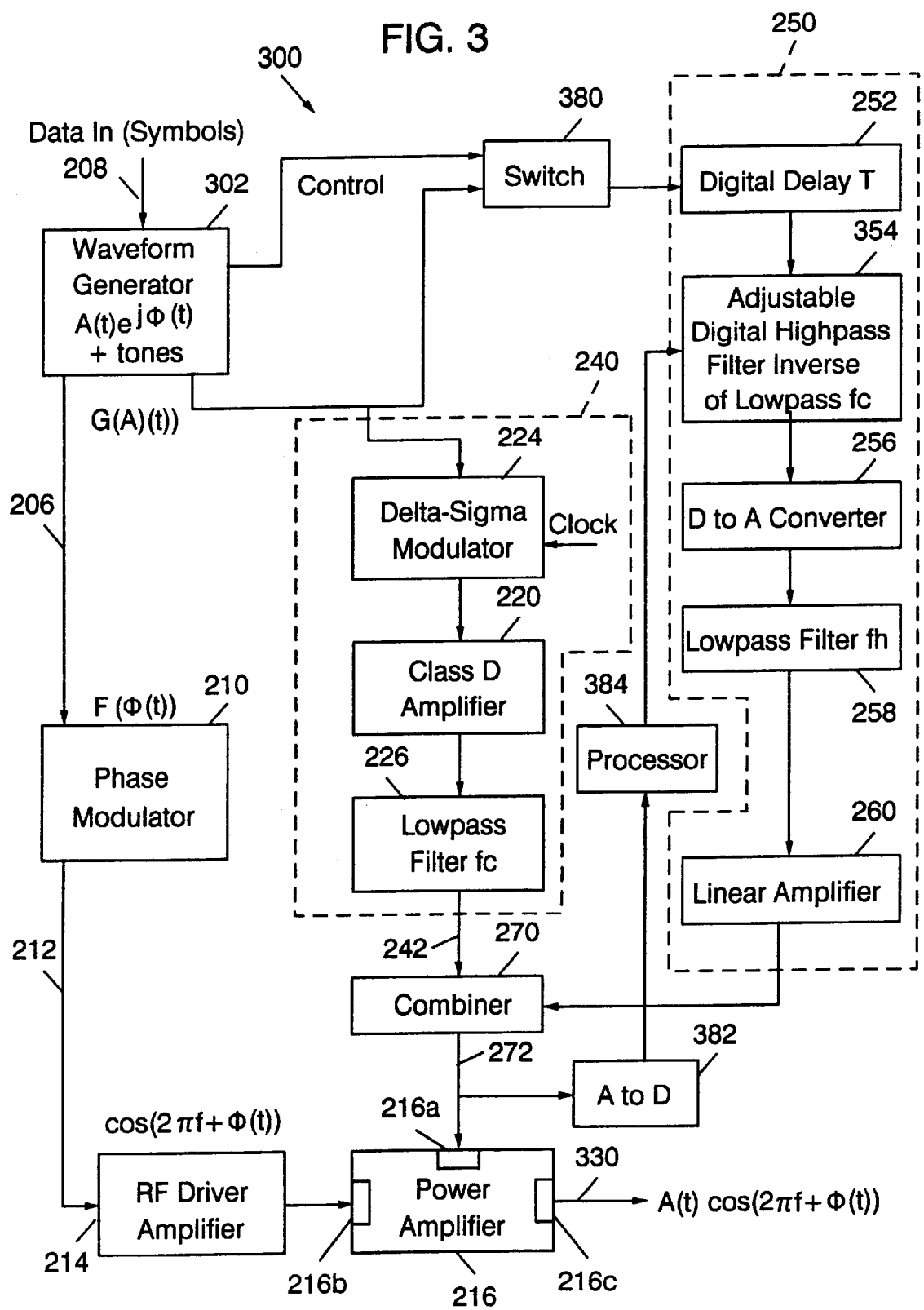

FIG. 3 is a block diagram of another embodiment of power modulation systems and methods 300 according to the present invention. It will be understood that the actual cutoff frequency $f_c$ of the lowpass filter 226 may vary based on manufacturing tolerances and/or other real world variations. Accordingly, it may be difficult to provide a highpass filter 254 in FIG. 2 that has a cutoff frequency that matches the actual cutoff frequency of the lowpass filter 226. In the embodiment of FIG. 3, an adjustable digital highpass filter 354 is provided. Means are also provided for adjusting the adjustable highpass cutoff frequency of the adjustable digital highpass filter 354 to be the same as a cutoff frequency $f_c$ of the lowpass filter 226. More specifically, means are provided for determining the lowpass filter cutoff frequency $f_c$ for adjusting the adjustable highpass cutoff frequency of the adjustable digital highpass filter 354 to be the same as the lowpass cutoff frequency so determined.

Specifically, in the embodiment shown in FIG. 3, the waveform generator 302 also generates test tones at specific frequencies instead of the amplitude modulation waveform 204, when desired. When the test tones are generated, the waveform generator 302 signals the switch 380 to open. An analog-to-digital converter 382 is coupled to the output of the combiner 270. The sampled data is then processed by a digital processor 384. The digital processor 384 adjusts the cutoff frequency of the adjustable digital highpass filter 354 to correspond to the measured cutoff frequency of the lowpass filter 226.

By measuring the amplitude and phase response of the lowpass filter 226 to ones of various frequencies in the region of the cutoff of that filter, the digital processor 384 can calculate an exact inverse function for the highpass filter. It will be understood that the number of tones may depend on the number of poles in the lowpass filter 226. It also will be understood that a determination of the lowpass cutoff frequency and an adjustment of the adjustable highpass cutoff frequency may be made in the analog domain. Finally, it will be understood that the parameters of the high frequency amplifying system also can be measured using the system of FIG. 3, wherein the tones are delivered to the high frequency amplifying system 250 rather than the low frequency amplifying system 240, and the response is measured using the analog-to-digital converter 382. This can be used to measure the gain and phase shift of the high frequency amplifying system 250. However, these measurements may not be needed because the components of the high frequency amplifying system may be well controlled since they are digital.

Figure 4:
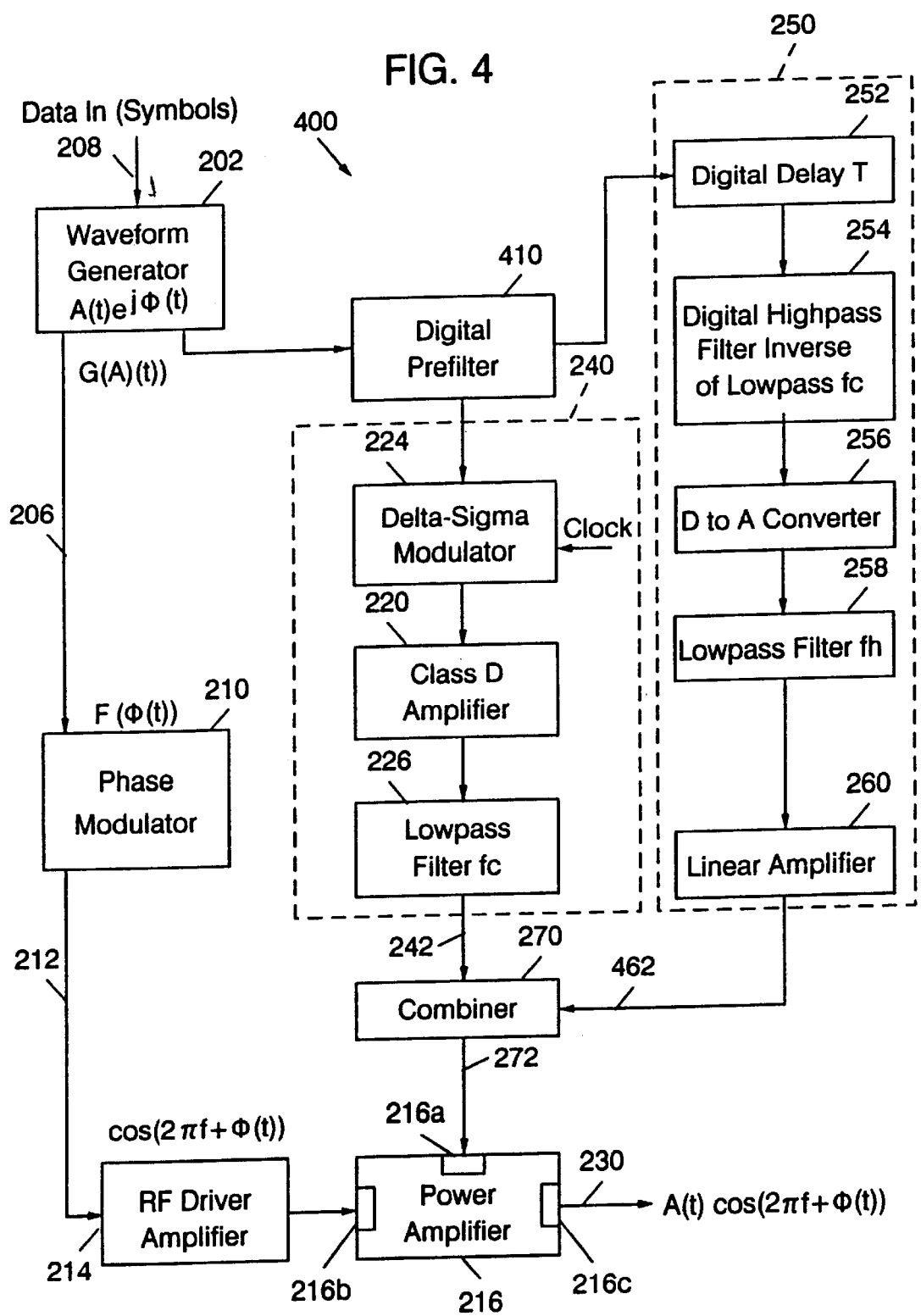

FIG. 4 illustrates other embodiments of systems and methods 400 of the present invention that couple a digital prefilter 410 between the waveform generator 202 and at least one of the low frequency amplifying system 240 and the high frequency amplifying system 250. The digital prefilter 410 may be used for various purposes as will be described in detail below.

In a first use of the digital prefilter 410, the digital prefilter 410 is a lowpass digital prefilter that has a lower cutoff frequency than that of the lowpass filter 226. By having a lower cutoff frequency in the digital filter, the effect of variations of the cutoff frequency $f_c$ of the lowpass filter 226 on the overall response of the system may be reduced and preferably eliminated. In other words, the digital prefilter 410 acts as a second lowpass filter that has a lower cutoff frequency than the lowpass filter 226. This cutoff frequency may be well controlled because it is generated in the digital domain. Accordingly, the digital highpass filter 254 may be matched to the cutoff frequency of the digital prefilter 410 rather than being matched to the cutoff frequency $f_c$ of the lowpass filter 226. Thus, the sensitivity to variations in the lowpass filter 226 may be reduced and preferably eliminated.

Figure 5A:
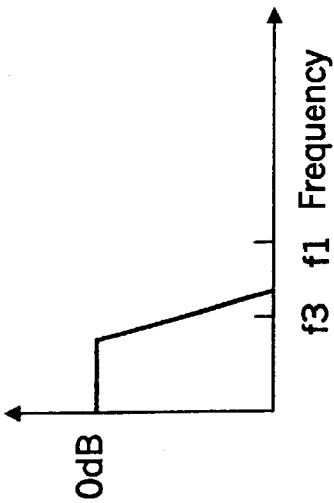
FIGS. 5A–5F and 6A–6F graphically illustrate frequency responses for various embodiments of FIG. 4.
Figure 5B:
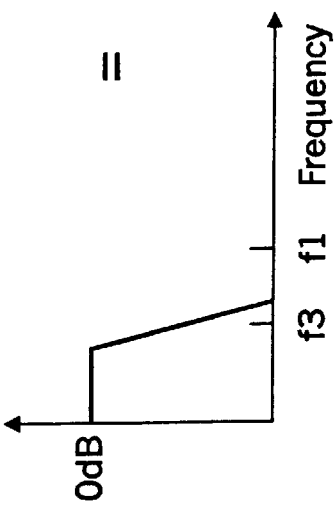
Figure 5C:
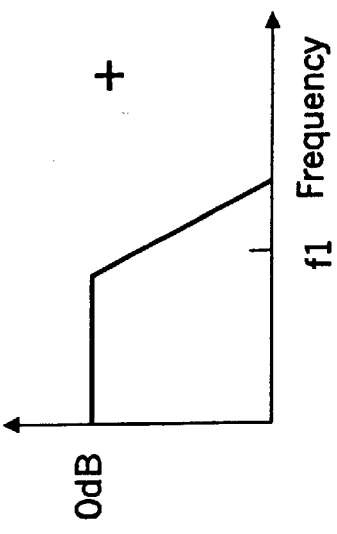
Figure 5D:
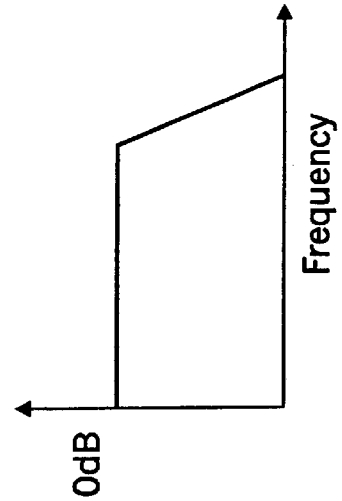
Figure 5E:
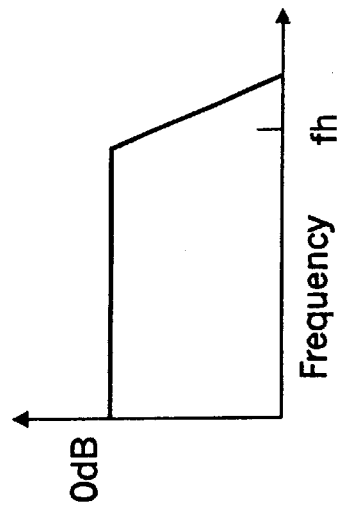
Figure 5F:
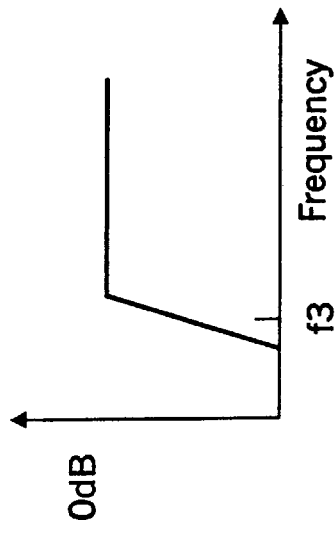

FIGS. 5A–5F illustrate frequency responses for this embodiment of FIG. 4. As shown in FIG. 5A, the lowpass filter 226 has a cutoff frequency $f_1$. As shown in FIG. 5B, the digital prefilter 410 has a cutoff frequency $f_3$ that is lower than $f_1$. Thus, as shown in FIG. 5C, the frequency response of the low frequency amplifying system 240 is governed by the frequency response of the prefilter 410. As shown in FIG. 5D, the digital highpass filter 254 is designed to have a cutoff frequency $f_3$ corresponding to the digital prefilter 410. The lowpass filter 258 has a high cutoff frequency $f_h$ that represents the highest frequencies that are modulated. Accordingly, the combined response in FIG. 5F is flat up to the desired cutoff frequency $f_h$. Stated differently, the cutoff frequency of the digital prefilter 410 is lower than the cutoff frequency of the analog lowpass filter 226. Thus, the frequency response of the low frequency amplifying system 240 is governed by the digital prefilter 410 with a group delay that may be influenced by the analog lowpass filter 226. Thus, the digital highpass filter 254 in the high frequency amplifying system 250 can be exactly tailored to match the low frequency amplifying system 240. When all the elements are combined, the combined frequency response is shown in FIG. 5F.

Figure 6A:
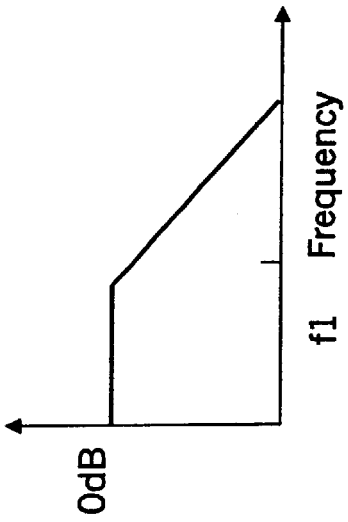
Figure 6B:
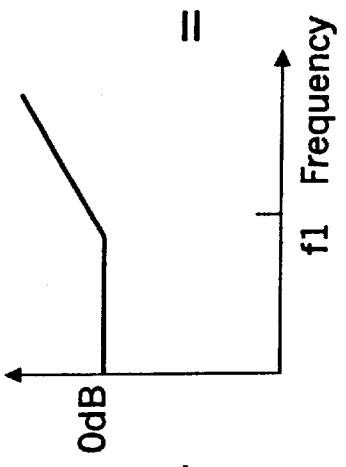
Figure 6D:
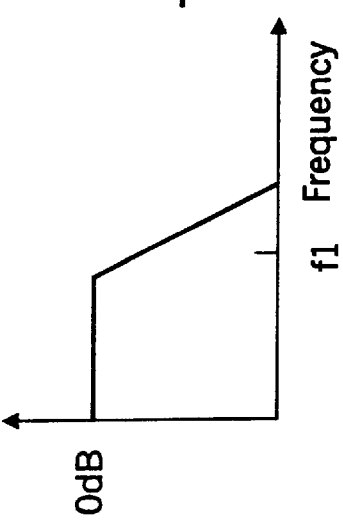
Figure 6C:
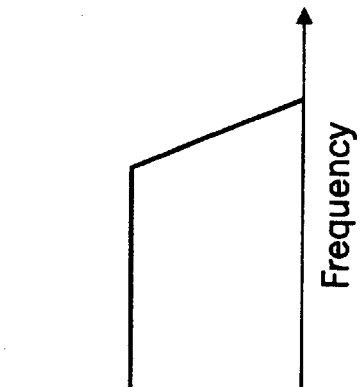

A second use of the digital prefilter 410 of FIG. 4 will now be described with the aid of FIGS. 6A–6F. As shown in FIG. 6A, the lowpass filter 226 of FIG. 4 maintains a cutoff frequency $f_1$. However, as shown in FIG. 6B, in this embodiment the digital prefilter 410 is a rising frequency digital filter that raises the amplitude of the amplitude waveform above the lowpass filter cutoff frequency $f_1$. As shown in FIG. 6C, this rising amplitude digital frequency thereby extends the lowpass cutoff frequency of the low frequency amplifying system to a second lowpass cutoff frequency that is higher than the original lowpass cutoff frequency.

Figure 6E:
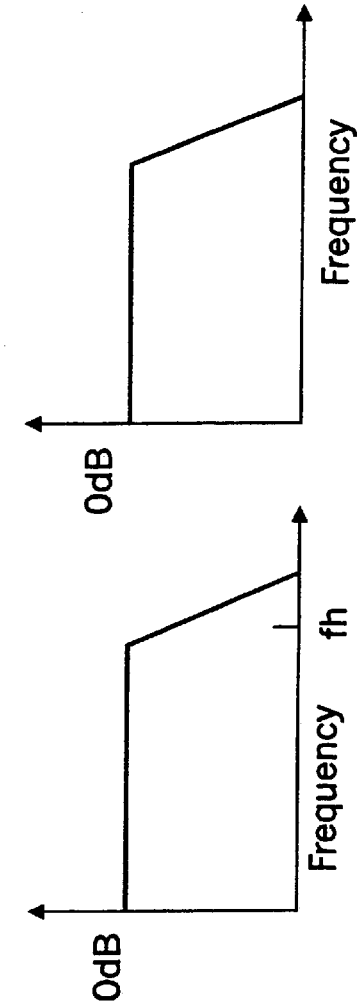
Figure 6F:
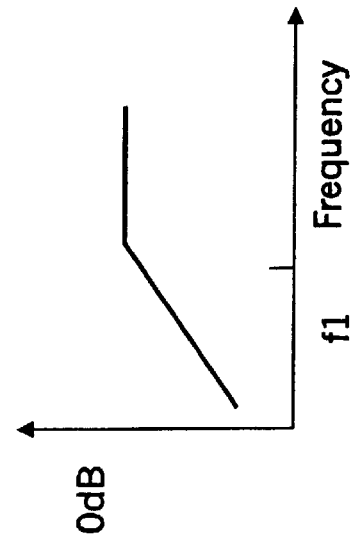

Stated differently, the effect of the digital prefilter 410 is to reduce the slope of loss versus frequency so that the order of the digital highpass filter 354 in the high frequency amplifying system 250 can be reduced. This is shown as a lower slope in the digital highpass filter response versus frequency of FIG. 6D. The response of the lowpass filter 258 is shown in FIG. 6E. The combined response of the low frequency amplifying system 240 and the high frequency amplifying system 250 results in a flat frequency response out to the bandwidth $f_h$ that is desired to support the amplitude modulation. Since the slope of the cutoff region of the combined digital prefilter and lowpass filter is less, the sensitivity of the digital highpass filter to match it may be less as well. However, the digital highpass filter and the high frequency amplifying system may show some sensitivity to variations in the frequency response of the first lowpass filter 258.

Comparing the digital prefilters of FIGS. 5A–5F and FIGS. 6A–6F, the very same frequency response may be obtained. However, for the digital prefilter of FIGS. 5A–5F, the likelihood of maintaining the proper phase and amplitude relationship between the low frequency amplifying system 240 and the high frequency amplifying system 250 may be higher. In fact, the only variation of any significance may be the group delay variation in the low frequency amplifying system 240 that should be matched by the digital delay 252 in the high frequency amplifying system 250. This delay may be due solely to the analog lowpass filter 226 and may be of lesser effect than due to mismatch in the cutoff frequency between the two amplifying systems.

Figure 7:
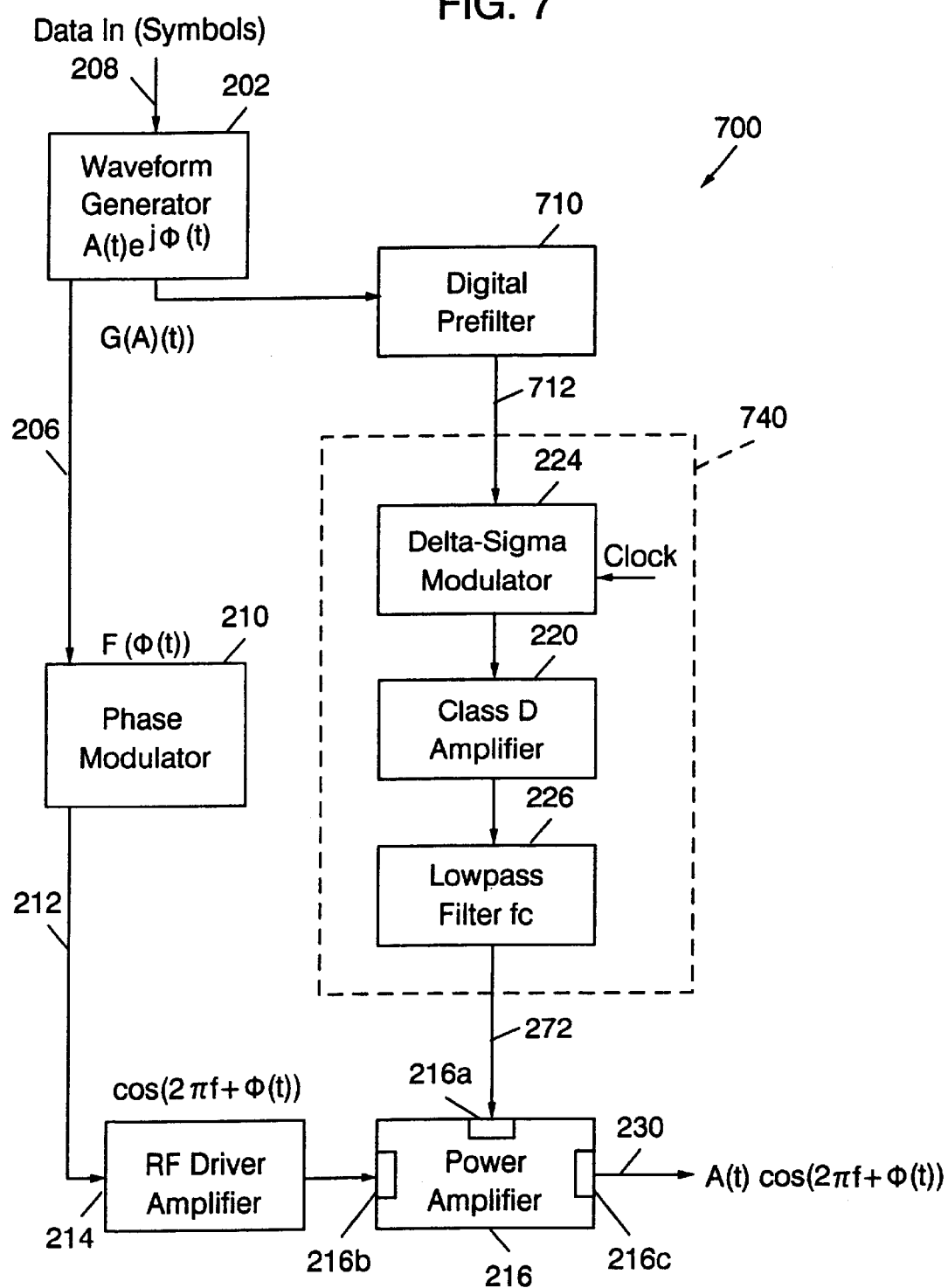
FIGS. 7–11 are block diagrams illustrating other embodiments of power modulation systems and methods according to the present invention.

In FIG. 6B, a rising amplitude digital prefilter 410 was used to extend the frequency response of the low frequency amplifying system 240. In another embodiment of the invention as shown in FIG. 7, the digital prefilter 710 is an inverse filter to the lowpass filter 226. In other words, the digital prefilter 710 is a highpass filter with the same cutoff frequency and slope as the lowpass filter 226. Thus, the digital prefilter 710 can completely remove the rolloff in the frequency response of the lowpass filter 226. Thus, the need for a high frequency amplifying system 250 may be eliminated.

Accordingly, as shown in the systems and methods 700 of FIG. 7, the amplitude waveform 204 is prefiltered by the digital prefilter 710 to produce a prefiltered amplitude waveform 712. The prefiltered amplitude waveform is then amplified to produce an amplified prefiltered amplified waveform 272. The amplifying system 740 includes a lowpass filter 226 having a first cutoff frequency $f_c$. The digital prefilter raises the amplitude of the amplitude waveform 204 above the first lowpass cutoff frequency $f_c$ to thereby extend the first lowpass cutoff frequency to a second lowpass cutoff frequency that is higher than the first lowpass cutoff frequency. Preferably, the amplitude of the amplitude waveform is raised above the first lowpass cutoff frequency in a manner that is complimentary to the lowpass filter 226, to thereby flatten the response of the amplifying system 740 beyond the first lowpass cutoff frequency. It will be understood that the digital prefilter 710 preferably also includes a lowpass filter portion with cutoff $f_h$, to limit the noise above that frequency.

It will be understood that the dynamic range of the digital prefilter 710 may become too large to be practical. For example, even though the digital prefilter 710 may be implemented in a digital processor associated with the waveform generator 202, it may exceed the digital resolution that is available. In this case, the digital prefilter may be used to cancel only some, but not all of the rolloff in the first lowpass filter 226 as was already described in connection with FIGS. 6A–6F.

Figure 8:
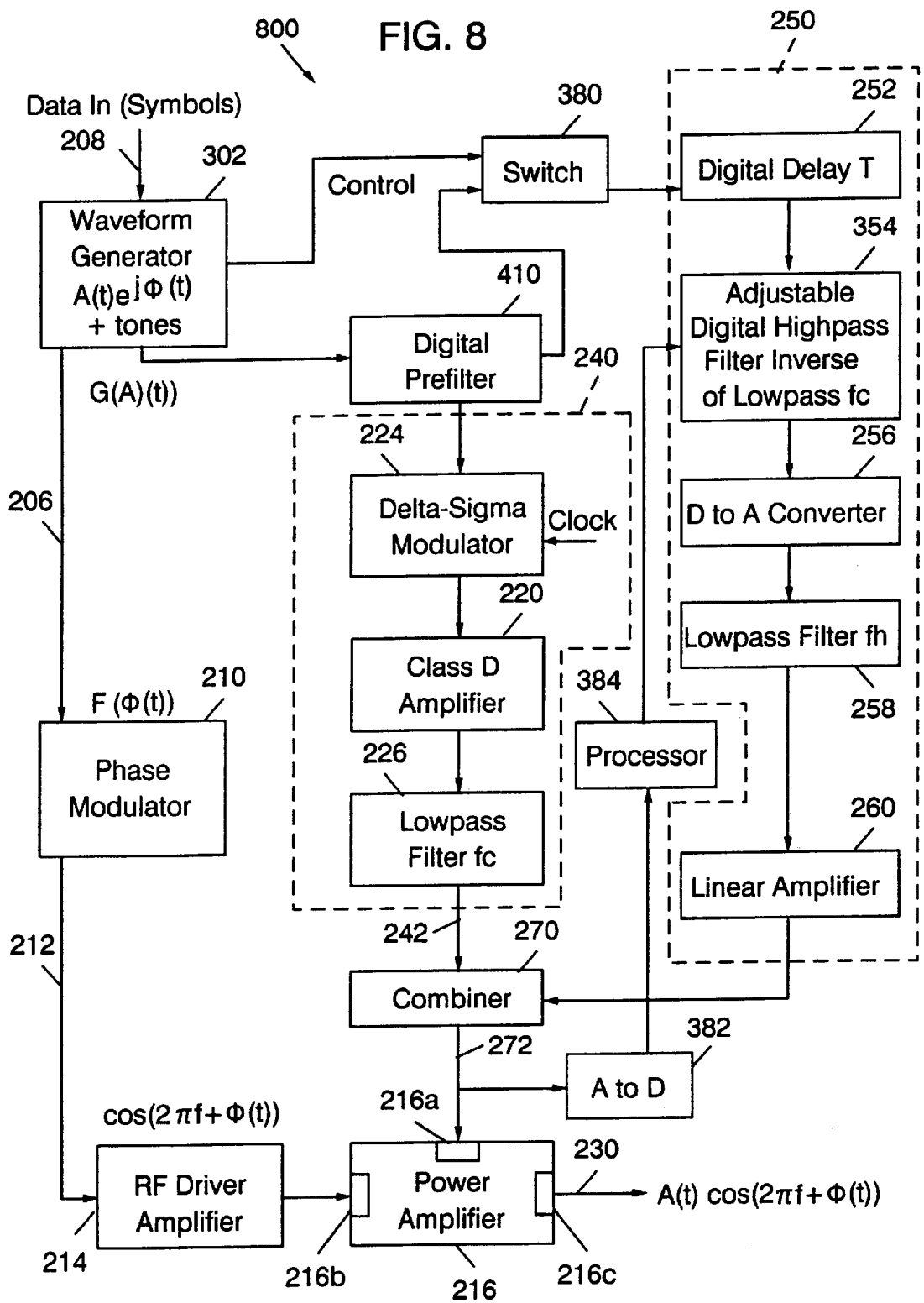

FIG. 8 illustrates another embodiment of power modulation systems and methods 800 according to the present invention. FIG. 8 combines the cutoff frequency determining system of FIG. 3 and the digital prefilter of FIG. 4 to reduce the effect of deviations in the cutoff frequency of the lowpass filter 226. Each of these systems has already been explained in detail in connection with FIGS. 3 and 4 and need not be described again.

Figure 9:
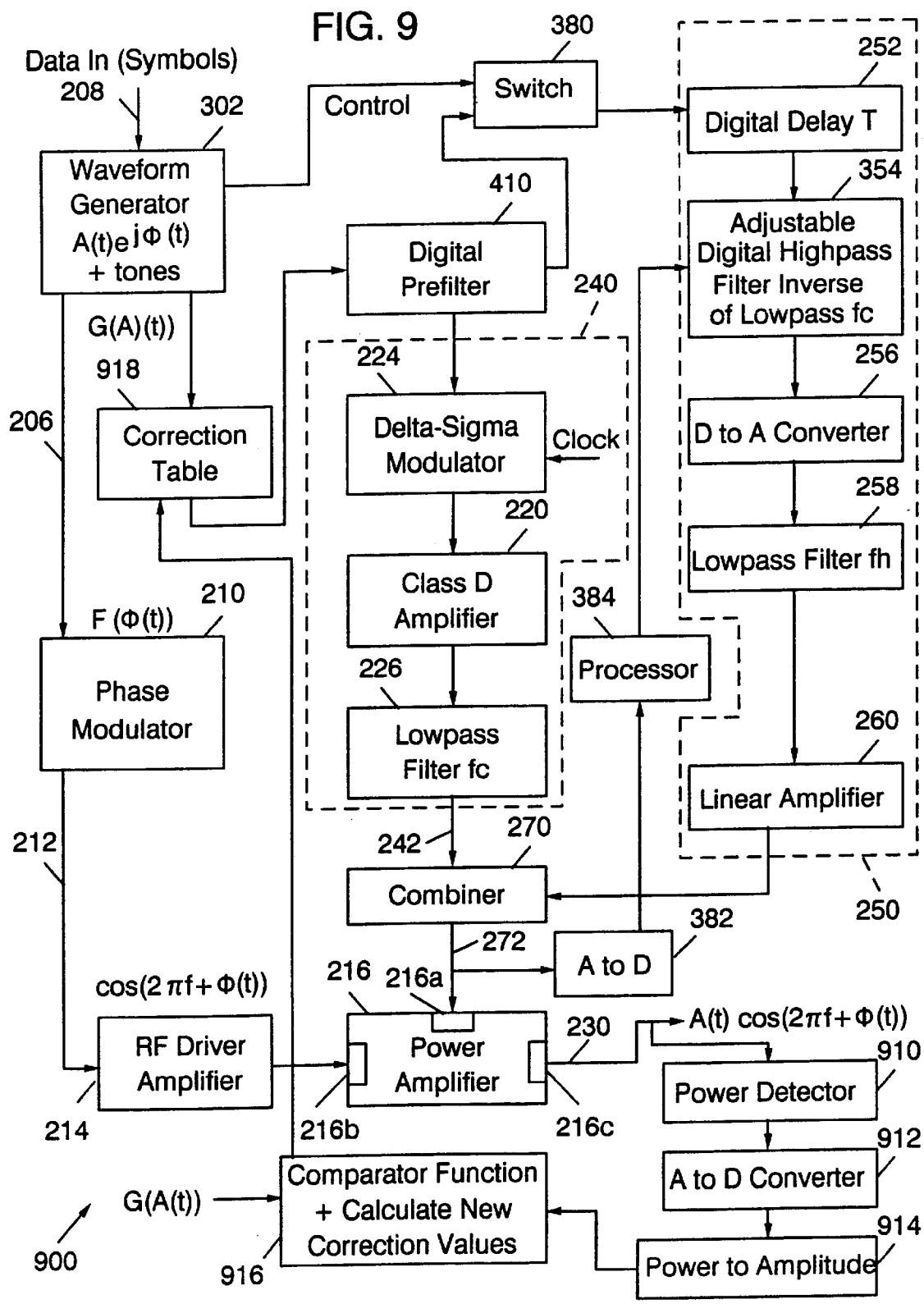

The Class-C power amplifier 216 can have a nonlinear relationship between supply voltage and output level, resulting in distortion. Such amplifiers can also suffer from Amplitude Modulation to Phase Modulation (AM-to-PM) conversion, whereby modulation of the amplitude produces undesired modulation of the phase. FIG. 9 illustrates power modulation systems and methods 900 that also compensate for such nonlinear distortion.

Referring to FIG. 9, the output signal amplitude may be measured using a power detector 910, the results of which are sampled and converted to digital by A to D converter 912 and converted to an amplitude value by a power to amplitude converter 914. This sampling may take place at a very slow rate. A comparator function 916 compares this amplitude to the value of the amplitude waveform G(A(t)) to calculate new correction values. Correction values are applied to a correction table 918.

Sampling is coordinated with the input to the amplitude modulation chain G(A(t)) so that the output of the power to amplitude conversion. 914 can be compared. If an error is detected, a new correction value can be calculated for the correction table 918 for that value of input amplitude. The waveform G(A(t)) is then converted to a corrected waveform by the correction table 918 and the corrected waveform is applied to the digital prefilter 410. The correction table takes the desired amplitude value and adds a correction value to it so that the net output amplitude is a linear response with the amplitude input value.

Since the nonlinearities involved may vary slowly with changes in temperature and/or loading, this sampling and adjustment of the correction table values can take place at a slow rate, for example 1–10 times per second, and in such a way that the total amplitude response values may be tested. Pre-compensation systems and methods are described in detail in the above-cited copending and commonly assigned patent applications and need not be described in further detail herein.

Figure 10:
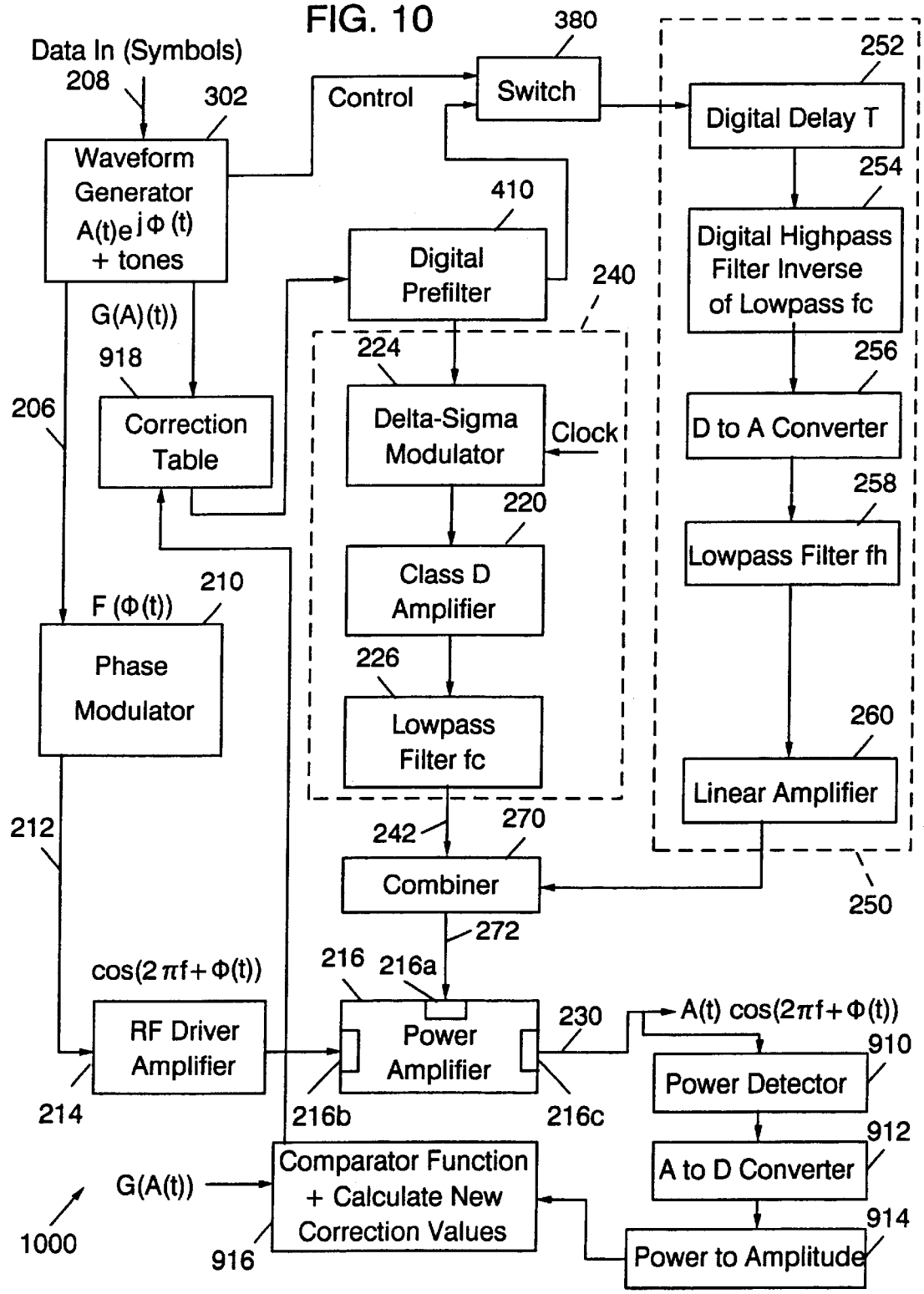
Figure 11:
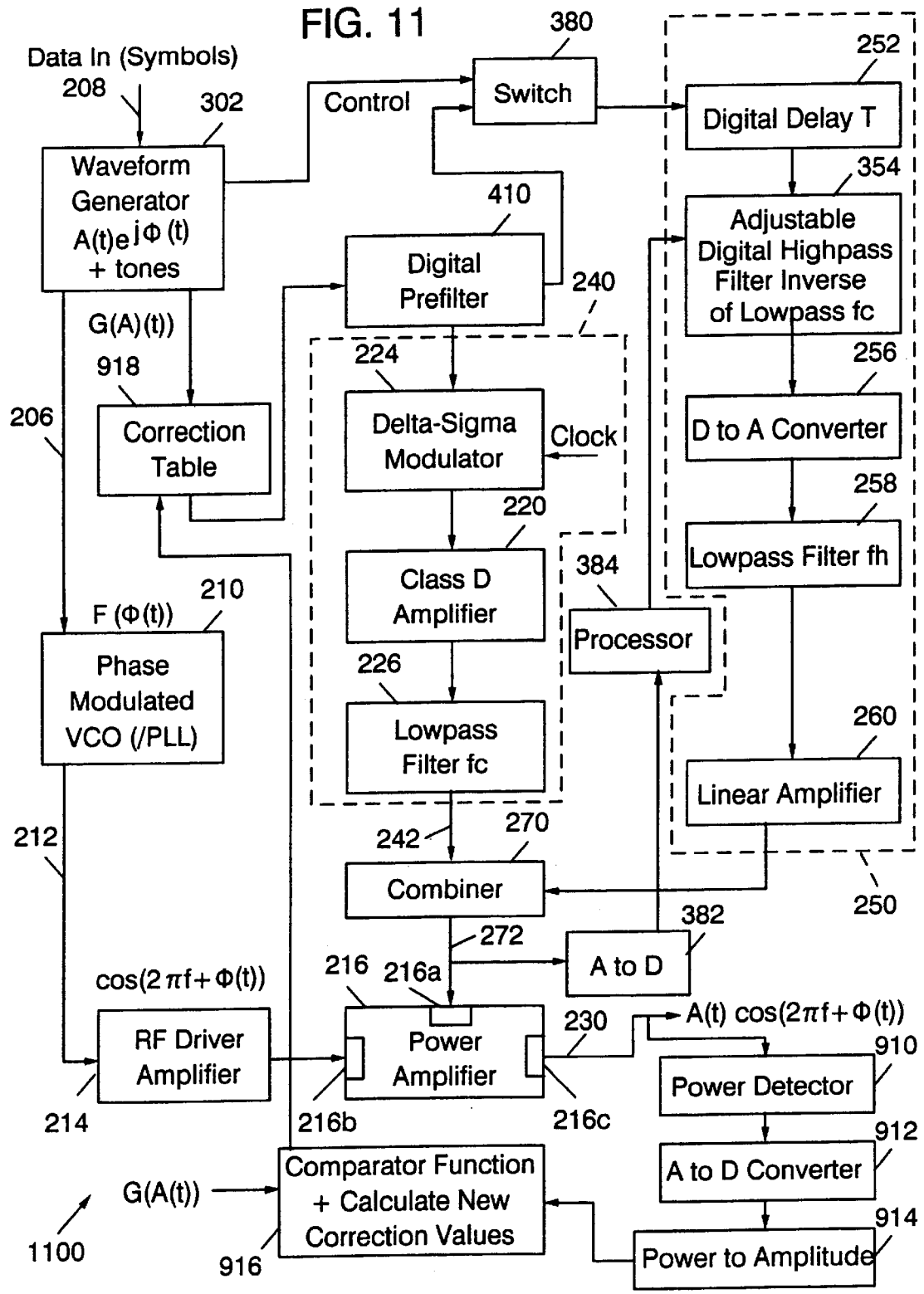

FIG. 10 illustrates another embodiment wherein the embodiment of FIG. 4 is combined with predistortion compensation of FIG. 9. FIG. 11 illustrates another embodiment wherein the embodiment of FIG. 3 is modified to add predistortion compensation of FIG. 9. Detailed descriptions of FIGS. 10 and 11 need not be repeated.

Figure 1:
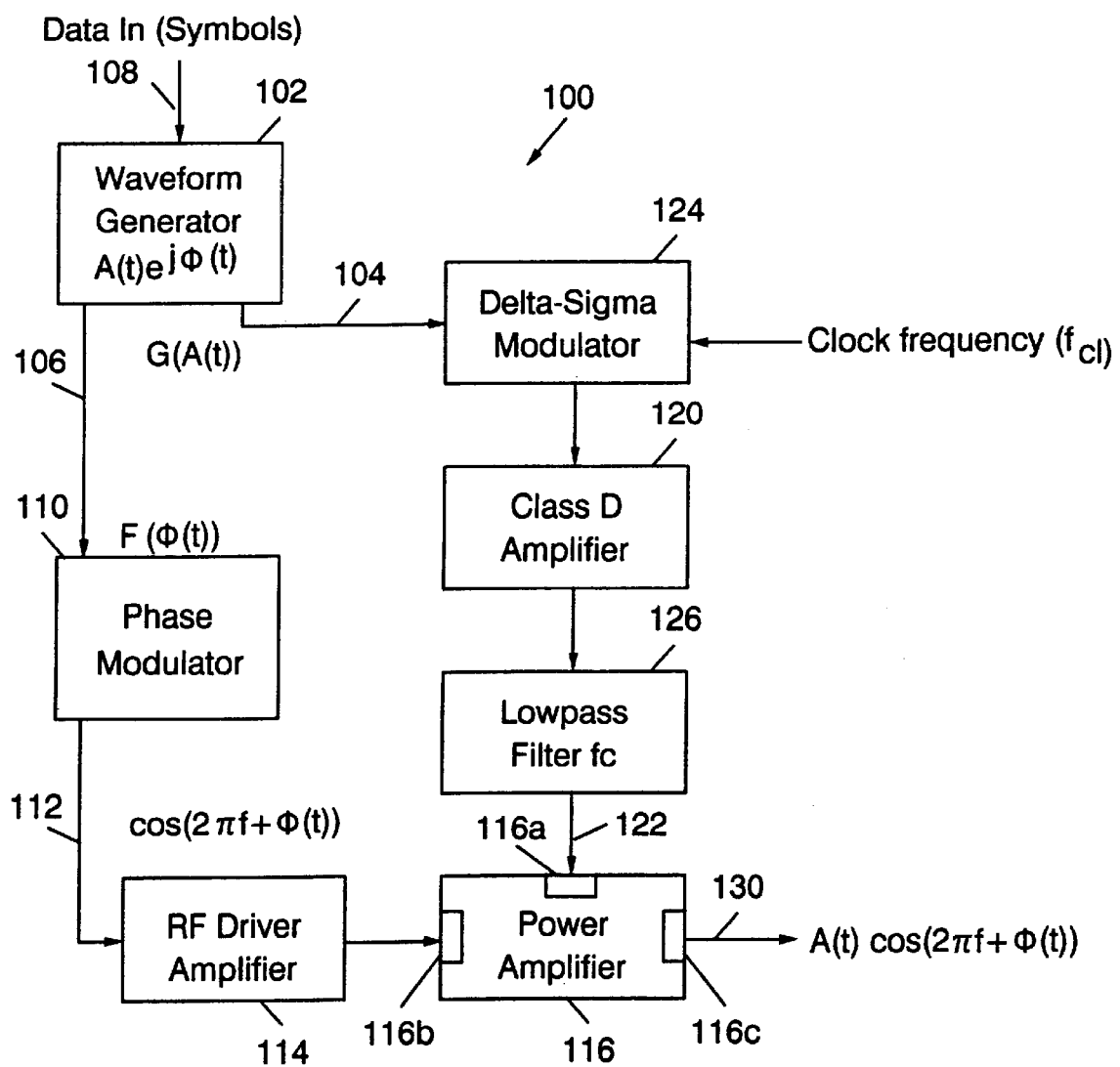
FIG. 1 is a block diagram of power modulation systems and methods that separately amplify amplitude and phase.
Figure 12:
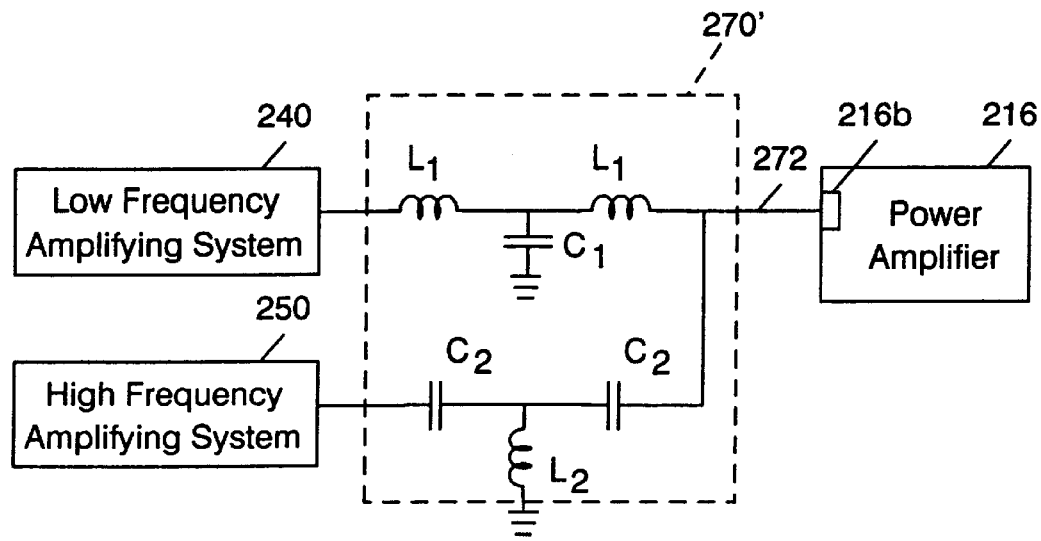
FIGS. 12 and 13 illustrate embodiments of combiners that may be used in power modulation systems and methods according to the present invention.

Referring again to FIG. 1, a first embodiment of combiners 270 according to the present invention will now be described. As shown in FIG. 12, the combiner 270' is used to couple the low frequency amplifying system 240 and high frequency amplifying system 250 to the signal input 216b of the power amplifier 216. When the digital highpass filter 254 matches the analog lowpass filter 226 (for example as shown in FIGS. 2, 3, 6A–6F, 8, 9, 10 and 11), the combiner may be a conventional diplexor comprising a highpass filter including capacitors C2 and inductor L2 and a lowpass filter comprising inductors L1 and capacitor C1. The digital highpass filter 254 may be retuned to the lower capacitor frequency to avoid mismatching the sum of two paths. Preferably, the cutoff of L1 equals the cutoff of L2 and the slopes preferably are equal. Other conventional combiners may be used to combine the outputs of the low frequency amplifying system and the high frequency amplifying system 240 and 250 respectively, while reducing and preferably minimizing interaction between these systems.

Figure 13:
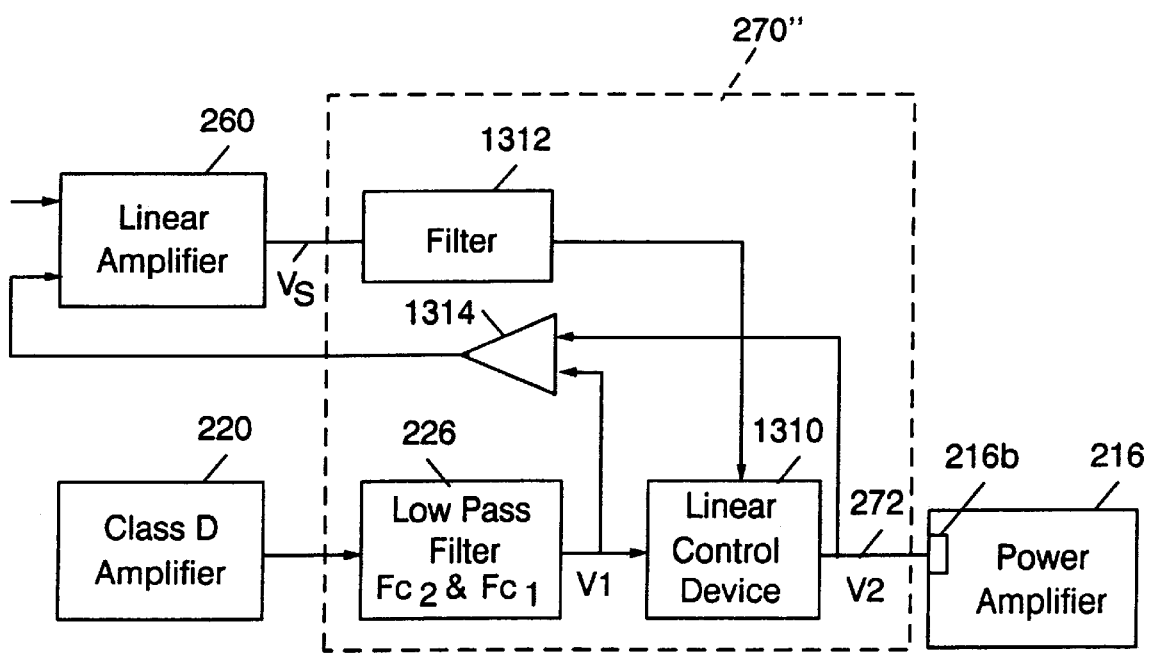

FIG. 13 illustrates another embodiment of a combiner 270" that may be used when the digital highpass filter 254 matches the digital lowpass filter which is less than the cutoff frequency of the analog lowpass filter 226. For example, as shown in FIGS. 5A–5F and 9–11, the digital prefilter 410 is of lower cutoff frequency than the cutoff frequency $f_c$ of the lowpass filter 226. As shown in FIG. 13, the combiner 270" includes a linear control device 1310 such as a field effect transistor, the source and drain of which are connected between the lowpass filter 236, the signal input 216 via the power amplifier 210. The gate of the linear control device 1310 is connected to the output of the linear amplifier 260 as filtered by a filter 1312. Voltages V1 and V2 across the linear control device are compared in a linear comparator 1314, the output of which is provided to a negative input terminal of the linear amplifier 260.

Thus, the linear comparator 1314 outputs the difference between V1 and V2. The loop comprising the comparator 1314, the linear amplifier 260, the filter 1312 and the linear control device 1310 causes V2–V1 to track $V_s$, where $V_s$ is the high frequency components of the composite signal with enough DC component to make $V_s$ greater than 0. The DC component preferably is minimized to minimize the impact on the total DC to DC efficiency. It will be understood that the control signal in the lower path may be scaled to account for the DC drop across the linear control device. It will also be understood that other combining circuits may be provided.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A power modulation system comprising:
   means for generating a digital amplitude waveform and a phase waveform from a plurality of data symbols, the digital amplitude waveform comprising a low frequency portion and a high frequency portion;
   means for phase modulating the phase waveform to produce a phase modulated waveform;

power amplifying means including a power supply input, a signal input and a power output, the phase modulated waveform being applied to the signal input;

means for amplifying the low frequency portion at high efficiency toproduces an amplified low frequency portion;

means for amplifying the high frequency portion at lower efficiency relative to the high efficiency to produce an amplified high frequency portion; and means for combining the amplified low frequency portion and the amplified high frequency portion to produce a combined amplified amplitude waveform, and for applying the combined amplified amplitude waveform to the power supply input, to produce a power modulated waveform of the data symbols at the power output.

2. A power modulation system according to claim 1 further comprising means for highpass filtering the amplitude waveform to generate the high frequency portion.

3. A power modulation system according to claim 2 wherein the means for amplifying the low frequency portion includes means for lowpass filtering therein, the means for lowpass filtering and the means for highpass filtering having same cutoff frequency.

4. A power modulation system comprising:

means for generating an amplitude waveform and a phase waveform from a plurality of data symbols, the amplitude waveform comprising a low frequency portion and a high frequency portion;

means for phase modulating the phase waveform to produce a phase modulated waveform;

power amplifying means including a power supply input, a signal input and a power output, the phase modulated waveform being applied to the signal input;

means for amplifying the low frequency portion at high efficiency to produce an amplified low frequency portion;

means for amplifying the high frequency portion at lower efficiency relative to the high efficiency to produce an amplified high frequency portion;

means for combining the amplified low frequency portion and the amplified high frequency portion to produce a combined amplified amplitude waveform, and for applying the combined amplified amplitude waveform to the power supply input, to produce a power modulated waveform of the data symbols at the power output; and means for highpass filtering the amplitude waveform to generate the high frequency portion;

wherein the means for amplifying the low frequency portion includes means for lowpass filtering therein, the means for lowpass filtering having a lowpass cutoff frequency, and wherein the means for highpass filtering comprises:

means for highpass filtering the amplitude waveform at an adjustable highpass cutoff frequency; and means for adjusting the adjustable highpass cutoff frequency to be same as the lowpass cutoff frequency.

5. A power modulation system according to claim 4 wherein the means for adjusting comprises:

means for determining the lowpass cutoff frequency; and means for adjusting the adjustable highpass cutoff frequency to be same as the lowpass cutoff frequency so determined.

6. A power modulation system according to claim 1 further comprising:

means for lowpass filtering the amplitude waveform to generate the low frequency portion; and means for highpass filtering the amplitude waveform to generate the high frequency portion.

7. A power modulation system according to claim 6 wherein the means for amplifying the low frequency portion includes second means for lowpass filtering therein, the second means for lowpass filtering having a second lowpass cutoff frequency, and wherein the means for lowpass filtering comprises:

means for lowpass filtering the amplitude waveform at a first lowpass cutoff frequency that is lower than the second lowpass cutoff frequency, to generate the low frequency portion.

8. A power modulation system comprising:

means for generating an amplitude waveform and a phase waveform from a plurality of data symbols, the amplitude waveform comprising a low frequency portion and a high frequency portion;

means for phase modulating the phase waveform to produce a phase modulated waveform;

power amplifying means including a power supply input, a signal input and a power output, the phase modulated waveform being applied to the signal input;

means for amplifying the low frequency portion at high efficiency to produce an amplified low frequency portion;

means for amplifying the high frequency portion at lower efficiency relative to the high efficiency to produce an amplified high frequency portion; and means for combining the amplified low frequency portion and the amplified high frequency portion to produce a combined amplified amplitude waveform, and for applying the combined amplified amplitude waveform to the power supply input, to produce a power modulated waveform of the data symbols at the power output;

wherein the means for amplifying the low frequency portion includes means for lowpass filtering therein, the means for lowpass filtering having a lowpass cutoff frequency, and wherein the power modulation system further comprises:

means for raising the amplitude of the amplitude waveform above the lowpass cutoff frequency to thereby extend the lowpass cutoff frequency to a second lowpass cutoff frequency that is higher than the lowpass cutoff frequency; and means for highpass filtering the amplitude waveform at the second lowpass cutoff frequency to thereby generate the high frequency portion.

9. A power modulation system according to claim 8 wherein the means for highpass filtering comprises:

means for highpass filtering the amplitude waveform at an adjustable highpass cutoff frequency; and means for adjusting the adjustable highpass cutoff frequency to be same as the second lowpass cutoff frequency.

10. A power modulation system comprising:

means for generating an amplitude waveform and a phase waveform from a plurality of data symbols, the amplitude waveform comprising a low frequency portion and a high frequency portion;

means for phase modulating the phase waveform to produce a phase modulated waveform;

power amplifying means including a power supply input, a signal input and a power output, the phase modulated waveform being applied to the signal input;

means for amplifying the low frequency portion at high efficiency to produce an amplified low frequency portion;

means for amplifying the high frequency portion at lower efficiency relative to the high efficiency to produce an amplified high frequency portion; and means for combining the amplified low frequency portion and the amplified high frequency portion to produce a combined amplified amplitude waveform, and for applying the combined amplified amplitude waveform to the power supply input, to produce a power modulated waveform of the data symbols at the power output;

wherein the power amplifying means produces nonlinear distortion, the power modulation system further comprising:

means for generating a predistorted amplitude waveform from the amplitude waveform, at least one of the means for amplifying the low frequency portion and the means for amplifying the high frequency portion being responsive to the predistorted amplitude waveform to thereby compensate for the nonlinear distortion.

11. A power modulation system according to claim 1 wherein the means for amplifying the low frequency portion comprises a class-D amplifier, wherein the means for amplifying the high frequency portion comprises a linear amplifier and wherein the means for power amplifying comprises a class-C amplifier.

12. A power modulation system comprising:

means for generating an amplitude waveform and a phase waveform from a plurality of data symbols, the amplitude waveform comprising a low frequency portion and a high frequency portion;

means for phase modulating the phase waveform to produce a phase modulated waveforn;

power amplifying means including a power supply input, a signal input and a power output, the phase modulated waveform being applied to the signal input;

means for amplifying the low frequency portion at high efficiency to produce an amplified low frequency portion;

means for amplifying the high frequency portion at lower efficiency relative to the high efficiency to produce an amplified high frequency portion; and means for combining the amplified low frequency portion and the amplified high frequency portion to produce a combined amplified amplitude waveform, and for applying the combined amplified amplitude waveform to the power supply input, to produce a power modulated waveform of the data symbols at the power output;

wherein the means for amplifying the low frequency portion comprises a class-D amplifier, wherein the means for amplifying the high frequency portion comprises a linear amplifier and wherein the means for power amplifying comprises a class-C amplifier; and wherein the means for amplifying the low frequency portion further comprises a delta sigma modulator that is coupled between the means for generating and the class-D amplifier.

13. A power modulation system comprising:

means for generating an amplitude waveform and a phase waveform from a plurality of data symbols, the amplitude waveform comprising a low frequency portion and a high frequency portion;

means for phase modulating the phase waveform to produce a phase modulated waveform;

power amplifying means including a power supply input, a signal input and a power output, the phase modulated waveform being applied to the signal input;

means for amplifying the low frequency portion at high efficiency to produce an amplified low frequency portion;

means for amplifying the high frequency portion at lower efficiency relative to the high efficiency to produce an amplified high frequency portion;

means for combining the amplified low frequency portion and the amplified high frequency portion to produce a combined amplified amplitude waveform, and for applying the combined amplified amplitude waveform to the power supply input, to produce a power modulated waveform of the data symbols at the power output; and a digital prefilter that is coupled between the amplitude waveform, the means for amplifying the low frequency portion and the means for amplifying the high frequency portion to generate the low frequency portion and the high frequency portion.

14. A power modulation system comprising:

a waveform generator that generates a digital amplitude waveform and a phase waveform from a plurality of data symbols, the digital amplitude waveform comprising a low frequency portion and a high frequency portion;

a phase modulator that phase modulates the phase waveform to produce a phase modulated waveform;

a power amplifier including a power supply input, a signal input and a power output, the phase modulated waveform being applied to the signal input;

a low frequency amplifying system that amplifies the low frequency portion at high efficiency to produce an amplified low frequency portion;

a high frequency amplifying system that amplifies the high frequency portion at lower efficiency relative to the high efficiency to produce an amplified high frequency portion; and a combiner that combines the amplified low frequency portion and the amplified high frequency portion to produce a combined amplified amplitude waveform, and that applies the combined amplified amplitude waveform to the power supply input, to produce a power modulated waveform of the data symbols at the power output.

15. A power modulation system according to claim 14 further comprising a highpass filter that is coupled to the amplitude waveform to generate the high frequency portion.

16. A power modulation system according to claim 15 wherein the low frequency amplifying system includes a lowpass filter therein, the lowpass filter and the highpass filter having same cutoff frequency.

17. A power modulation system comprising:

a waveform generator that generates an amplitude waveform and a phase waveform from a plurality of data symbols, the amplitude waveform comprising a low frequency portion and a high frequency portion;

a phase modulator that phase modulates the phase waveform to produce a phase modulated waveform;

a power amplifier including a power supply input, a signal input and a power output, the phase modulated waveform being applied to the signal input;

a low frequency amplifying system that amplifies the low frequency portion at high efficiency to produce an amplified low frequency portion;

a high frequency amplifying system that amplifies the high frequency portion at lower efficiency relative to the high efficiency to produce an amplified high frequency portion;

a combiner that combines the amplified low frequency portion and the amplified high frequency portion to produce a combined amplified amplitude waveform, and that applies the combined amplified amplitude waveform to the power supply input, to produce a power modulated waveform of the data symbols at the power output; and a highpass filter that is coupled to the amplitude waveform to generate the high frequency portion;

wherein the low frequency amplifying system includes a lowpass filter therein, the lowpass filter having a lowpass cutoff frequency, and wherein the highpass filter comprises:

an adjustable highpass filter having an adjustable high bypass cutoff frequency.

18. A power modulation system according to claim 14 further comprising:

a lowpass filter that is coupled to the amplitude waveform to generate the low frequency portion; and a highpass filter that is coupled to the amplitude waveform to generate the high frequency portion.

19. A power modulation system according to claim 18 wherein the low frequency amplifying system includes a second lowpass filter therein, the second lowpass filter having a second lowpass cutoff frequency, and wherein the lowpass filter has a first lowpass cutoff frequency that is lower than the second lowpass cutoff frequency, to generate the low frequency portion.

20. A power modulation system according to claim 14 wherein the low frequency amplifying system comprises a Class-D amplifier, wherein the high frequency amplifying system comprises a linear amplifier and wherein the power amplifier comprises a Class-C amplifier.

21. A power modulation method comprising the steps of:

generating the digital amplitude waveform and a phase waveform from a plurality of data symbols, the digital amplitude waveform comprising a low frequency portion and a high frequency portion;

phase modulating the phase waveform to produce a phase modulated waveform;

amplifying the low frequency portion at high efficiency to produce an amplified low frequency portion;

amplifying the high frequency portion at lower efficiency relative to the high efficiency to produce an amplified high frequency portion;

combining the amplified low frequency portion and the amplified high frequency portion to produce a combined amplified amplitude waveform;

applying the combined amplified amplitude waveform to a power supply input of a power amplifier; and applying the phase modulated waveform to a signal input of the power amplifier, to produce a power modulated waveform of the data symbols.

22. A power modulation method according to claim 21 further comprising the step of highpass filtering the amplitude waveform to generate the high frequency portion.

23. A power modulation method according to claim 22 wherein the step of amplifying the low frequency portion includes the step of lowpass filtering at same cutoff frequency as the step of highpass filtering.

24. A power modulation method comprising the steps of:

generating an amplitude waveform and a phase waveform from a plurality of data symbols, the amplitude waveform comprising a low frequency portion and a high frequency portion;

phase modulating the phase waveform to produce a phase modulated waveform;

amplifying the low frequency portion at high efficiency to produce an amplified low frequency portion;

amplifying the high frequency portion at lower efficiency relative to the high efficiency to produce an amplified high frequency portion;

combining the amplified low frequency portion and the amplified high frequency portion to produce a combined amplified amplitude waveform;

applying the combined amplified amplitude waveform to a power supply input of a power amplifier;

applying the phase modulated waveform to a signal input of the power amplifier, to produce a power modulated waveform of the data symbols; and highpass filtering the amplitude waveform to generate the high frequency portion;

wherein the step of amplifying the low frequency portion includes the step of lowpass filtering at a lowpass cutoff frequency, and wherein the step of highpass filtering comprises the steps of:

highpass filtering the amplitude waveform at an adjustable highpass cutoff frequency; and adjusting the adjustable highpass cutoff frequency to be same as the lowpass cutoff frequency.

25. A power modulation method according to claim 24 wherein the step of adjusting comprises:

determining the lowpass cutoff frequency; and adjusting the adjustable highpass cutoff frequency to be same as the lowpass cutoff frequency so determined.

26. A power modulation method according to claim 21 further comprising the steps of:

lowpass filtering the amplitude waveform to generate the low frequency portion; and highpass filtering the amplitude waveform to generate the high frequency portion.

27. A power modulation method according to claim 26 wherein the step of amplifying the low frequency portion includes the step of lowpass filtering at a second lowpass cutoff frequency, and wherein the step of lowpass filtering the amplitude waveform comprises the step of:

lowpass filtering the amplitude waveform at a first lowpass cutoff frequency that is lower than the second lowpass cutoff frequency, to generate the low frequency portion.

28. A power modulation method comprising the steps of:

generating an amplitude waveform and a phase waveform from a plurality of data symbols, the amplitude waveform comprising a low frequency portion and a high frequency portion;

phase modulating the phase waveform to produce a phase modulated waveform;

amplifying the low frequency portion at high efficiency to produce an amplified low frequency portion;

amplifying the high frequency portion at lower efficiency relative to the high efficiency to produce an amplified high frequency portion;

combining the amplified low frequency portion and the amplified high frequency portion to produce a combined amplified amplitude waveform;

applying the combined amplified amplitude waveform to a power supply input of a power amplifier; and applying the phase modulated waveform to a signal input of the power amplifier, to produce a power modulated waveform of the data symbols;

wherein the step of amplifying the low frequency portion includes the step of lowpass filtering at a lowpass cutoff frequency, and wherein the power modulation method further comprises the steps of:

raising the amplitude of the amplitude waveform above the lowpass cutoff frequency to thereby extend the lowpass cutoff frequency to a second lowpass cutoff frequency that is higher than the lowpass cutoff frequency; and highpass filtering the amplitude waveform at the second lowpass cutoff frequency to thereby generate the high frequency portion.

* * * * *

UNITED STATES PATENT AND TRADEMARK OFFICE
CERTIFICATE OF CORRECTION

PATENT NO. : 6,590,940 B1
DATED : July 8, 2003
INVENTOR(S) : Camp, Jr. et al.

Page 1 of 1

It is certified that error appears in the above-identified patent and that said Letters Patent is hereby corrected as shown below:

Title page,
Item [56], References Cited, U.S. PATENT DOCUMENTS, the following references should be listed:

| | | | |
|---|---|---|---|
| -- 5,452,293 | 9/1995 | Wilkinson | 370/54 |
| 5,530,698 | 6/1996 | Kozaki | 370/60.1 |
| 5,627,836 | 5/1997 | Conoscenti | 370/397 |
| 5,631,903 | 5/1997 | Dianda | 370/401 |
| 5,802,050 | 9/1998 | Petersen et al. | 370/394 |
| 5,809,023 | 9/1998 | Petersen et al. | 370/395 |
| 5,822,321 | 10/1998 | Petersen et al. | 370/474 |
| 5,898,669 | 4/1999 | Shimony | 370/232 |
| 5,946,309 | 8/1999 | Westberg et al. | 370/395 |
| 6,341,131 | 1/2002 | Eneroth | 370/395 -- |

Signed and Sealed this

Twenty-first Day of September, 2004

JON W. DUDAS
*Director of the United States Patent and Trademark Office*